(12) United States Patent
Tan et al.

(10) Patent No.: US 8,612,814 B1
(45) Date of Patent: Dec. 17, 2013

(54) MEMORY ERROR DETECTION CIRCUITRY

(75) Inventors: Jun Pin Tan, Kepong (MY); Kiun Kiet Jong, Serian (MY); Boon Jin Ang, Bagan Ajam (MY)

(73) Assignee: Altera Corporation, San Jose, CA (US)

( * ) Notice: Subject to any disclaimer, the term of this patent is extended or adjusted under 35 U.S.C. 154(b) by 315 days.

(21) Appl. No.: 12/814,713

(22) Filed: Jun. 14, 2010

(51) Int. Cl.
*G01R 31/28* (2006.01)

(52) U.S. Cl.
USPC ........................................... 714/732

(58) Field of Classification Search
USPC ............................ 714/724, 725, 732
See application file for complete search history.

(56) References Cited

U.S. PATENT DOCUMENTS

| | | | |
|---|---|---|---|
| 6,615,379 B1 * | 9/2003 | Tripp et al. .................. | 714/736 |
| 6,744,274 B1 * | 6/2004 | Arnold et al. ................. | 326/16 |
| 6,944,836 B1 * | 9/2005 | Lai ................................ | 716/136 |
| 7,225,373 B1 * | 5/2007 | Edwards et al. .............. | 714/725 |
| 7,424,658 B1 * | 9/2008 | Ghosh Dastidar ............ | 714/738 |
| 7,437,641 B1 * | 10/2008 | Gorshe ......................... | 714/732 |
| 7,437,643 B2 * | 10/2008 | Khanna et al. ................ | 714/733 |
| 7,461,309 B2 * | 12/2008 | Kiryu ............................ | 714/729 |
| 7,475,311 B2 * | 1/2009 | Kiryu ............................ | 714/732 |
| 7,500,163 B2 * | 3/2009 | Rajski et al. .................. | 714/729 |
| 7,627,798 B2 * | 12/2009 | Kiryu ............................ | 714/733 |
| 7,634,713 B1 | 12/2009 | Ngo | |
| 7,734,968 B2 * | 6/2010 | Grupp et al. .................. | 714/724 |
| 8,086,925 B2 * | 12/2011 | Gass et al. .................... | 714/738 |

OTHER PUBLICATIONS

Ninh D. Ngo, U.S. Appl. No. 12/608,835, filed Oct. 29, 2009.
Ninh D. Ngo, U.S. Appl. No. 11/436,967, filed May 16, 2006.
Wageningen et al., U.S. Appl. No. 11/407,484, filed Apr. 20, 2006.

* cited by examiner

*Primary Examiner* — James C Kerveros
(74) *Attorney, Agent, or Firm* — Treyz Law Group; Jason Tsai

(57) ABSTRACT

Integrated circuits with error detection circuitry are provided. Integrated circuits may include memory cells organized into frames. The error detection circuitry may compress each frame to scan for soft errors. The error detection circuitry may include multiple input shift registers (MISRs), a data register, and a signature comparator. The data frames may be read, compressed, and shifted into the MISRs in parallel. After all the data frames have been read, the MISRs may provide a scanned MISR signature at their outputs. Computer-aided design (CAD) tools may be used to calculate a precomputed MISR signature. The precomputed MISR signature may be loaded into the data register. The signature comparator compares the scanned MISR signature with the precomputed MISR signature. If the signatures match, then the device is free of soft errors. If the signatures do not match, then at least one soft error exists.

14 Claims, 7 Drawing Sheets

MEMORY ERROR DETECTION CIRCUITRY

BACKGROUND

This relates to integrated circuits such as integrated circuits with memory, and more particularly, to circuitry for detecting soft memory errors in integrated circuits such as programmable integrated circuits.

Programmable integrated circuits are a type of integrated circuit that can be programmed by a user to implement a desired custom logic function. In a typical scenario, a logic designer uses computer-aided design tools to design a custom logic circuit. When the design process is complete, the tools generate configuration data. The configuration data is loaded into memory elements to configure the devices to perform the functions of the custom logic circuit.

Memory elements are often based on random-access-memory (RAM) cells. Because the RAM cells are loaded with configuration data during device programming, the RAM cells are sometimes referred to as configuration memory or configuration random-access-memory cells (CRAM).

During normal operation of a programmable device, loaded CRAM cells produce static output signals that are applied to the gates of transistors (e.g., pass transistors). The CRAM output signals turn some transistors on and turn other transistors off. This selective activation of certain transistors on the device customizes the operation of the device so that the device performs its intended function.

When operating in a system, programmable devices are subject to environmental background radiation. Particularly in modern programmable devices that contain large numbers of CRAM cells, there is a possibility that a radiation strike on a CRAM cell will cause the CRAM cell to change its state. For example, a CRAM cell storing a "one" configuration bit may flip its state so that the cell erroneously stores a "zero" bit. When a CRAM cell changes state, the transistor being controlled by that CRAM cell will be placed into an erroneous state. The transistor might, for example, be turned on when it should have been turned off.

Radiation-induced errors that arise in configuration random-access-memory cells are sometimes referred to as soft errors. One way in which soft errors can be addressed is to change the design of the configuration random-access-memory cells. However, changes to the configuration random-access-memory cells can introduce undesired circuit complexity and can consume additional circuit real estate. As a result, it is often necessary to use a configuration random-access-memory cell architecture that occasionally produces soft errors.

Programmable devices sometimes include error detection circuitry that continuously monitors an entire array of CRAM cells. If an error is detected in the array, an error flag may be set. Systems that require highly reliable operations can monitor the status of the error flag to determine whether the programmable device has experienced any soft errors. So long as no errors are present, the system allows the programmable device to operate normally. If, however, the state of the error flag indicates that one of the configuration random-access-memory cells on the device has exhibited a soft error, the system can reconfigure the device by reloading the original configuration data into the configuration random-access-memory cells.

Conventional error detection circuitry includes a data register and a linear feedback shift register. A given frame (i.e., a column of memory elements that are connected to a shared address line) is read and latched by the data register. The data register then shifts the given frame into the linear feedback shift register.

Each frame in the programmable device is read and shifted into the linear feedback shift register. The linear feedback shift register provides output values that are compared to preloaded cyclic redundancy check (CRC) values. If the values match, then the memory cells in that particular frame (if error detection is performed on a per-frame basis) or device (if error detection is performed on a per-chip basis) are error free. If the values do not match, then at least one soft error exists in that particular frame or device.

Detecting soft errors using this approach is slow, because scan time is linearly dependent on the number of memory elements being scanned. Shifting latched data into the linear feedback shift register requires numerous clock cycles and consumes large amount of dynamic power. As design complexity and the number of memory cells increase in future generations of integrated circuits, detecting soft errors using this type of error detection circuitry may be unacceptably slow and may consume significant amounts of power.

It would therefore be desirable to be able to provide integrated circuits with improved error detection circuitry.

SUMMARY

Integrated circuits such as programmable integrated circuits may have memory elements connected to error detection circuitry. The error detection circuitry may be used to monitor (scan) the memory cells for the presence of soft errors.

For example, a programmable integrated circuit may contain one or more arrays of configuration random-access-memory (CRAM) cells. Each array may contain rows and columns of configuration random-access-memory cells that are used for storing configuration data. The integrated circuit may also be organized into different logic regions, each logic region having its own set of memory arrays.

Columns of a memory array form data frames. The error detection circuitry processes each data frame to determine whether a soft error has occurred. The error detection circuitry contains multiple input shift registers (MISRs), data register circuitry, and signature comparator circuitry. The input shift registers may be used to compress and latch each data frame in parallel. After all of the frames have been compressed and shifted into the MISRs, the MISRs will provide a scanned MISR signature at their outputs.

Computer-aided design (CAD) tools may be used to calculate a precomputed MISR signature. The CAD tools can calculate the precomputed MISR signature based on a desired pattern of configuration data that is to be loaded into the array and based on the deterministic (predictable) behavior of the MISRs. The precomputed MISR signature may be loaded into a data register in the data register circuitry.

When every data frame on the device has been compressed, the signature comparator may be used to compare the scanned MISR signature with the precomputed MISR signature. If the signature comparator outputs a high error signal, then at least one soft error exists. If the signature comparator outputs a low error signal, then the device is free of soft errors.

The signature comparator may support a double error detection scheme. The signature comparator may detect errors at a local level to indicate whether an error has occurred in a particular logic region. The signature comparator may detect errors at a global level to indicate whether an error has occurred on a per-chip basis.

Further features of the invention, its nature and various advantages will be more apparent from the accompanying drawings and the following detailed description of the preferred embodiments.

DETAILED DESCRIPTION

This relates to integrated circuits and more particularly, to circuitry for detecting soft errors in volatile memory elements.

Integrated circuits that contain memory elements may include memory chips, digital signal processing circuits with memory arrays, microprocessors, application specific integrated circuits with memory arrays, programmable logic device integrated circuits or other programmable integrated circuits in which memory elements are used for configuration memory, or any other suitable integrated circuits.

Programmable integrated circuits such as programmable logic device integrated circuits use programmable memory elements to store configuration data. During the programming of a programmable integrated circuit, configuration data is loaded into the memory elements. During operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

Memory elements may be organized in arrays having numerous rows and columns. For example, memory array circuitry may be formed in hundreds or thousands of rows and columns on a programmable logic device integrated circuit. Programmable integrated circuit 10 of FIG. 1 is an example of an illustrative integrated circuit on which memory array circuitry may be formed.

Figure 1:
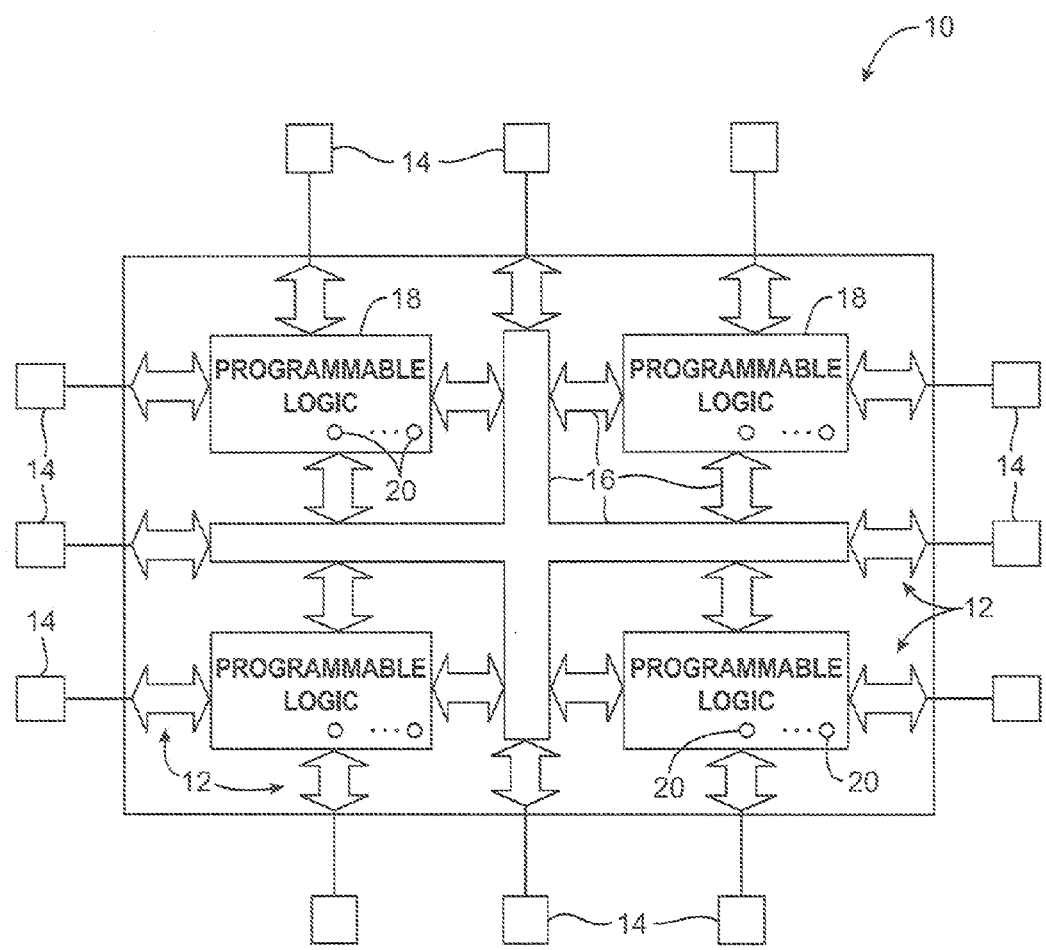
FIG. 1 is a diagram of an illustrative integrated circuit with an array of memory cells such as a programmable integrated circuit in accordance with an embodiment of the present invention.

As shown in FIG. 1, programmable integrated circuit 10 may have input/output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and input/output circuitry 12. Once loaded, the memory elements each provide a corresponding static control output signal that controls the state of an associated logic component in programmable logic 18. Typically the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Figure 2:
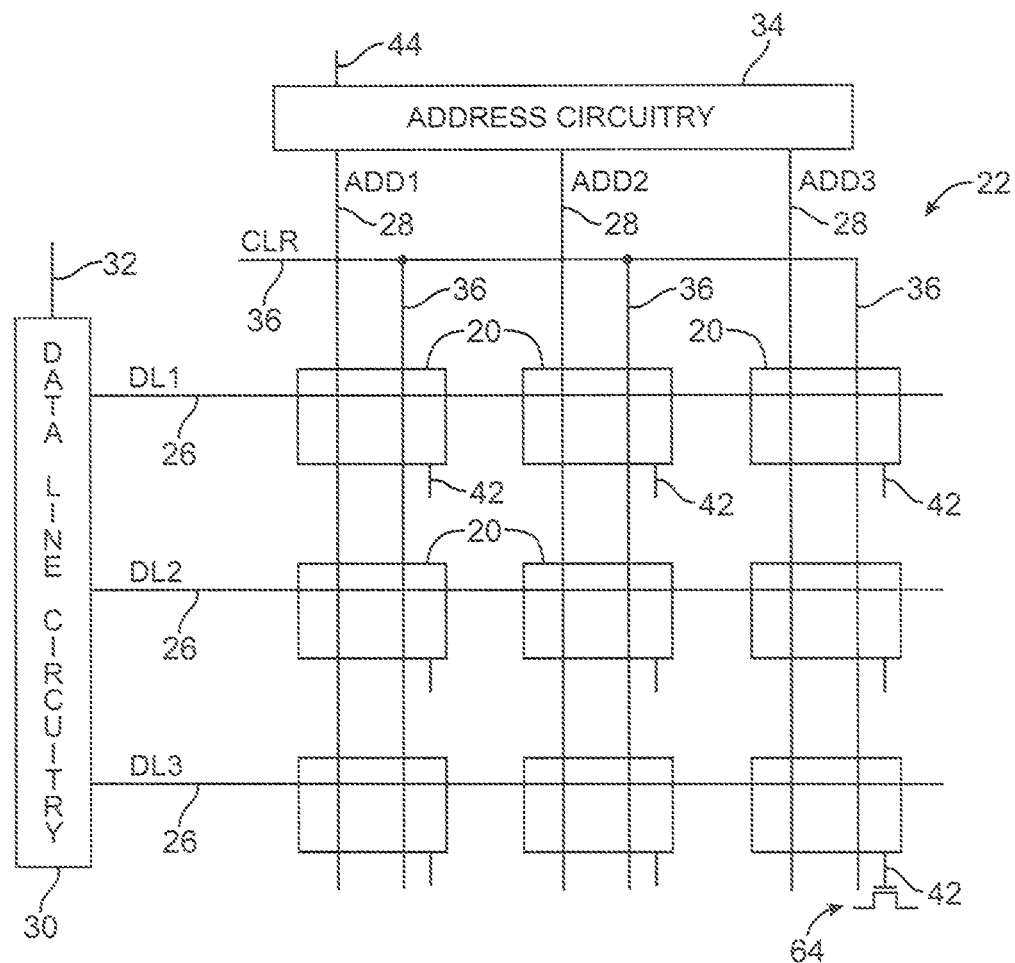
FIG. 2 is a diagram of an illustrative memory cell array in accordance with an embodiment of the present invention.

When memory elements are arranged in an array, horizontal and vertical conductors and associated circuitry may be used to load the memory elements with configuration data and may be used to read data from the memory elements. An illustrative arrangement for data loading and data reading on integrated circuit 10 is shown in FIG. 2. The arrangement of FIG. 2 has a 3×3 array 22 of memory elements 20. Actual memory arrays typically have hundreds or thousands of rows and columns.

As shown in FIG. 2, a clear line 36 (labeled CLR) may be used to clear the contents of the memory array 22. After the array has been cleared, configuration data may be loaded. After configuration data has been loaded, the contents of memory elements 20 in array 22 may be read.

Configuration data may be provided in series to registers in data line circuitry 30 via input 32. During data writing operations, the configuration data may be provided in parallel to array 22 via the DL1, DL2, and DL3 data lines 26. During data read operations, data may be read from array 22 via the data lines 26.

Address decoder circuitry in address circuitry 34 may receive addressing information via input 44 during data writing and data reading operations. In response, the address decoder may assert a desired one of the address lines 28 (i.e., ADD1, ADD2, or ADD3). When an address line is asserted in a given column during data write operations, the data on the data lines 26 is loaded into the memory elements 20 in that column. The array may be filled by systematically loading the memory elements in each of the columns of the array. After the array has been completely loaded with configuration data, the static control output 42 of each memory element 20 produces a corresponding static control signal for controlling the gate of a pass transistor or other logic component on the programmable logic device (e.g., a pass transistor such as pass transistor 64). When an address line is asserted in a given column during data read operations, data from the memory elements in the addressed column is driven onto the data lines 26. Data line output latches and other read circuitry in data line circuitry 30 may be used in handling the data signals from data lines 26. If desired, address circuitry 34 may include an address shift register that sequentially asserts each address line.

Modern programmable integrated circuits may contain memory arrays with millions or billions of CRAM cells. The columns of a memory cell array are typically referred to as frames (data frames). A frame may contain any suitable number of CRAM cells. For example, a frame may contain 6000 CRAM cells. If background radiation causes the state of any of the 6000 CRAM cells that are in use to flip, the operation of the programmable device may be disrupted. Errors induced as a result of such radiation strikes may sometimes be referred to as soft errors.

Figure 3:
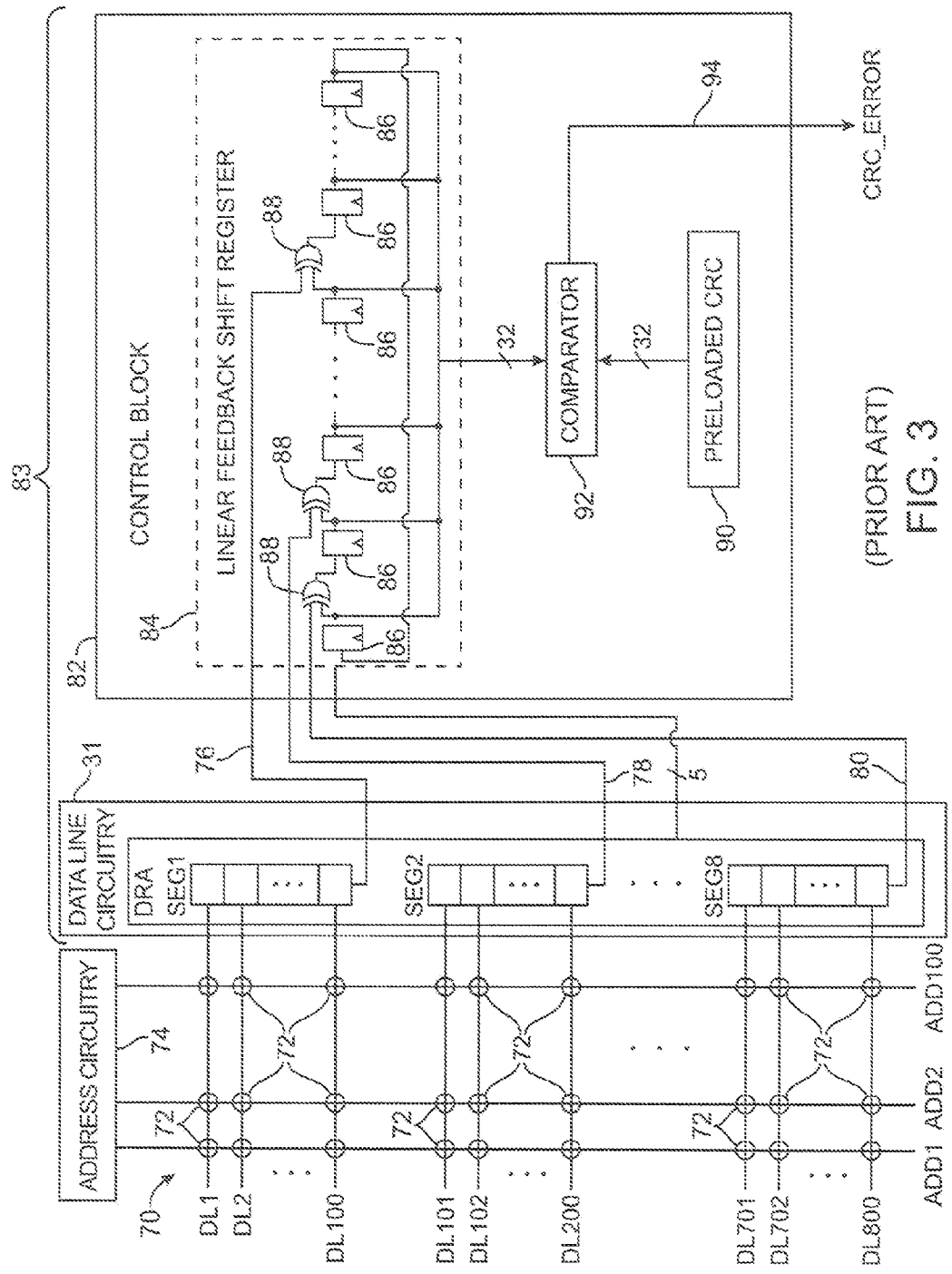
FIG. 3 is a diagram of conventional error detection circuitry.

FIG. 3 shows a programmable integrated circuit that includes conventional soft error detection circuitry 83. As shown in FIG. 3, CRAM memory array 70 has CRAM memory cells 72 arranged in rows and columns. Array 70 may have 800 rows and 100 columns of memory cells 72 (as an example). Cells 72 in each column are connected to a corresponding address line. For example, cells 72 in the first column (frame) of memory cells are connected to address line ADD1, cells 72 in the second column of memory cells are connected to address line ADD2, cells 72 in the 100$^{th}$ column of memory cells are connected to address line ADD100, etc. Each address line (i.e., address lines ADD1, ADD2, . . . , ADD100) is connected to address circuitry 74.

Cells 72 in each row are connected to a corresponding data line. For example, cells 72 in the first row of memory cells are connected to data line DL1, cells 72 in the second row of memory cells are connected to data line DL2, cells 72 in the 800$^{th}$ row are connected to data line DL800, etc. Each data line (i.e., data lines DL1, DL2, . . . , DL800) is connected to data line circuitry 31.

Data line circuitry 31 includes data register DRA. Data register DRA includes eight segment registers (or register segments) SEG1-SEG8. Segment registers SEG1-SEG8 are sometimes referred to as shift registers. Each segment register has inputs that are connected to associated data lines. For example, segment register SEG1 has 100 inputs that are respectively connected to data lines DL1-DL100, segment register SEG2 has 100 inputs that are respectively connected to data lines DL101-DL200, segment register SEG8 has 100 inputs that are respectively connected to data lines DL701-DL800, etc.

Each register segment has an output that is connected to control block 82. Data register DRA and control block 82 form conventional error detection circuitry 83.

Address circuitry 74 is used to load the configuration data stored in memory array 70 into data register DRA. The columns of memory array 70 may be referred to as frames. Memory array 70 has 100 frames (as an example). Address circuitry 74 sequentially asserts address lines ADD1-ADD100 to load configuration data into the segment registers of data register DRA one frame at a time.

Each frame is loaded into segment registers SEG1-SEG8 in parallel. There may be a five clock cycle delay when reading from the first frame, because it takes five clock cycles to read and sense data from a column of memory cells. Following the initial five clock cycle delay, segment registers SEG1-SEG8 latch the first frame. Each segment register then serially shifts its latched data into control block 82.

Control block 82 includes a linear feedback shift register (LFSR) 84, a preloaded cyclic redundancy check (CRC) circuit 90, and a comparator 92. A linear feedback shift register is a shift register that receives an input that is generated using a linear function of its current latched data. An LFSR is typically used to generate pseudo-random numbers in a deterministic fashion.

LFSR 84 has eight inputs that are connected to the eight outputs of segment registers SEG1-SEG8. For example, the output of register SEG1 is connected to the first input of LFSR 84 (as indicated by line 76), the output of register SEG2 is connected to the second input of LFSR 84 (as indicated by line 78), the output of register SEG8 is connected to the eighth input of LFSR 84 (as indicated by line 80), etc.

Data register DRA serially shifts each frame into LFSR 84. As a result, its takes 100 clock cycles to shift each frame from the eight register segments of FIG. 3 into LFSR 84. The number of clock cycles used to shift each frame into LSFR 84 is equal to the length of each segment register (i.e., the number of data lines to which each segment register is connected).

LFSR 84 includes 32 flip-flops 86 and eight logic XOR gates 88. Flip-flops 86 are arranged in a ring. Each XOR gate 88 is coupled between a respective pair of adjacent flip-flops 86. For example, the first XOR gate 88 is coupled between first and second flip-flops 86, as shown in FIG. 3. Each gate 88 has a first input that is connected to an output of a previous flip-flop 86 (i.e., a first of the two flip-flops in the pair of adjacent flip-flops between which gate 88 is coupled), a second input that receives data from one of the segment registers (e.g., segment registers SEG1, SEG2, etc.), and an output that is connected to an input of a following flip-flop 86 (i.e., a second of the two flip-flops in the pair of adjacent flip-flops between which gate 88 is coupled). The output of last flip-flop 86 is connected to the input of first flip-flop 86.

A second frame can be read while the first frame is being shifted into LFSR 84. Once the first frame has been shifted into LFSR 84, data register DRA latches the second frame and starts shifting the second frame into LFSR 84 for the next 100 clock cycles.

Reading and shifting each frame in memory array 70 using this approach is slow, because serially shifting the latched data from segment registers SEG1-SEG8 into LFSR 84 takes numerous clock cycles (e.g., 100 clock cycles are required to shift each frame into LFSR 84). The error detection time $T_{ED}$ for conventional error detection circuitry 83 can be calculated using equation 1.

$$T_{ED} = n_{FRAME} * (n_{DL}/8) * T_{CLK} \quad (1)$$

As shown in equation 1, error detection time $T_{ED}$ for conventional error detection circuitry 83 is equal to the product of the number of frames $n_{FRAME}$, the number of data lines $n_{DL}$ divided by eight, and the clock period $T_{CLK}$.

The first term $n_{FRAME}$ takes into account the number of frames that need to be read for the entire chip. The second term ($n_{DL}/8$) expresses the number of clock cycles that it takes to shift each frame from data register DRA into LFSR 84 (assuming data register DRA is partitioned into eight separate segment registers). The third product $T_{CLK}$ takes into account the duration of each clock cycle.

For example, consider a scenario in which error detection circuitry of the type described in connection with FIG. 3 is used to detect soft errors in an integrated circuit with 75,000 frames and 8,000 data lines. In this example, the error detection circuitry operates at 150 MHz. Conventional error detection time $T_{ED}$ per-chip is therefore equal to 500 ms (75,000*8,000/8*[150*10$^6$]$^{-1}$).

Error detection time $T_{ED}$ represents the amount of time that it takes to shift all the frames into LFSR 84. Flip-flops 86 in LFSR 84 have outputs that collectively form a 32-bit wide LFSR output that provides 32-bit scanned LFSR data. Preloaded CRC circuit 90 is loaded with 32-bit preloaded CRC data that is provided over a 32-bit wide CRC output.

Comparator 92 has a first input that is connected to the LSFR output, a second input that is connected to the CRC output, and an output 94. Comparator 92 compares the scanned LFSR data with the preloaded CRC data provided at its inputs. If the scanned LFSR data is equal to the preloaded CRC data, then comparator 92 will output a low error signal CRC_ERROR over line 94 (e.g., comparator 92 will indicate that the integrated circuit is free of soft errors). If the scanned LFSR data does not match the preloaded CRC data, then comparator 92 will output a high error signal CRC_ERROR over line 94 (e.g., comparator 92 will indicate that at least one soft error has been detected).

In other conventional integrated circuits, error detection circuitry such as conventional circuitry 83 of FIG. 2 has been used to detect errors in CRAM memory arrays on a per-frame basis. In this type of circuit, CRAM content is also read and shifted into a control block in 8 bit data streams. A CRC is computed and compared to a preloaded CRC for each frame of CRAM data. If the computed CRC and preloaded CRC for a particular frame do not match, it can be concluded that the frame contains an error.

Whether using conventional error detection circuitry that detects soft errors on a per-frame basis or conventional error detection circuitry that detects errors on a per-chip basis, conventional approaches may be unacceptably slow for integrated circuits having a large number of memory elements (e.g., millions of CRAM memory cells).

Figure 4:
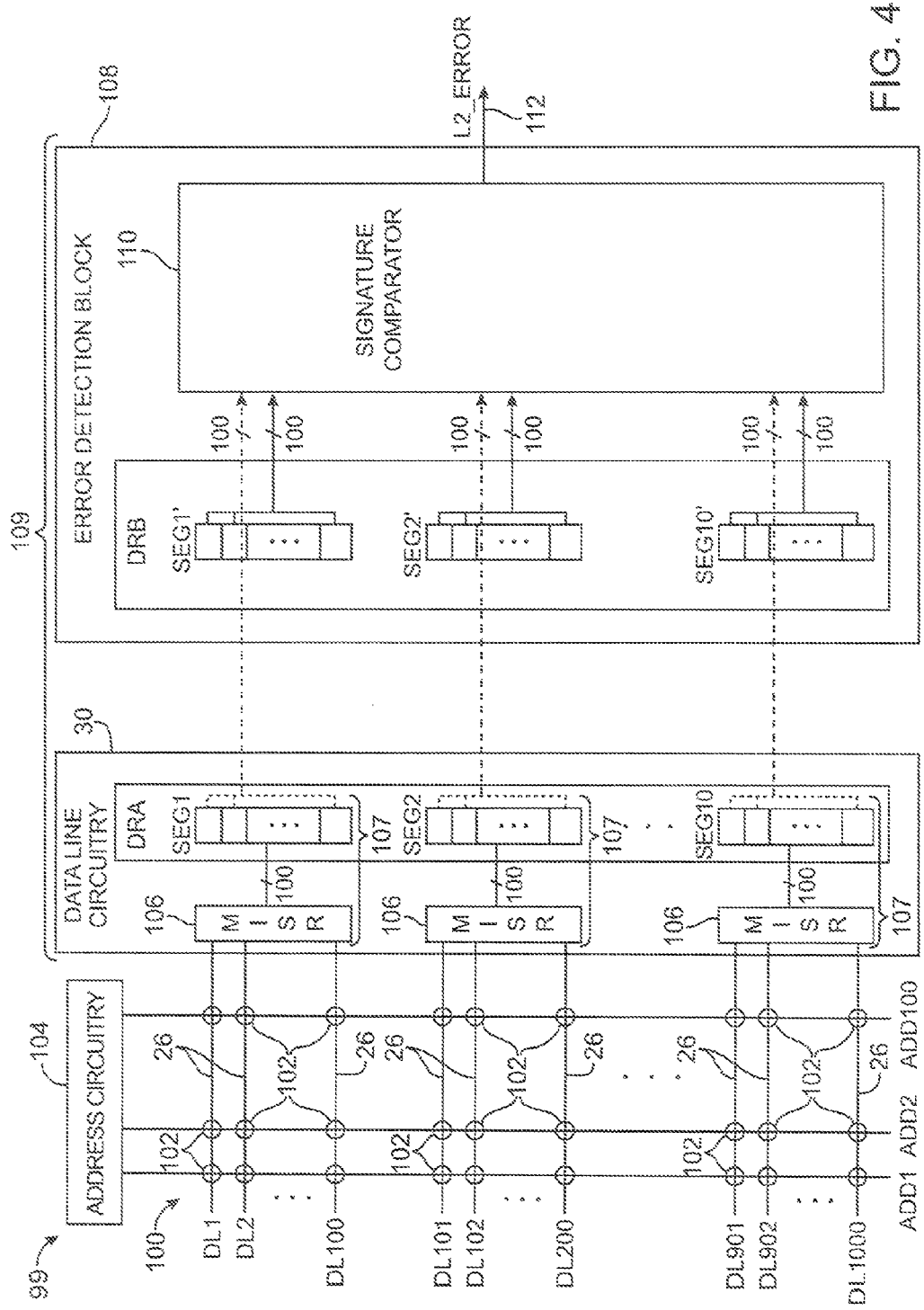
FIG. 4 is a diagram of illustrative error detection circuitry that includes multiple input shift registers in accordance with an embodiment of the present invention.

A circuit arrangement that may provide increased error detection speed is shown in FIG. 4. As shown in FIG. 4, memory array 100 that is connected to error detection circuitry 109. Error detection circuitry 109 may include multiple input shift registers (MISRs). Multiple input shift registers may be used to accelerate testing by compressing multiple input data streams into a scanned MISR signature. MISRs may therefore also be referred to as multiple input signature registers.

Unlike linear feedback shift registers, each multiple input shift register receives and processes data in parallel. Compressing data using MISRs can therefore significantly reduce test time, because processing data in parallel can be significantly faster than serially shifting data.

For example, consider a scenario in which a 200-bit shift register loads data into a linear feedback shift register (LFSR). Loading data from the 200-bit shift register into the LFSR takes 200 clock cycles, because the LSFR only has a single input that serially receives data from the 200-bit shift register (as an example).

In contrast, consider another scenario in which a 200-bit shift register loads data into a multiple input shift register (MISR) that has 200 inputs. Loading data from the 200-bit shift register into the MISR may only take one clock cycle, because the 200 inputs of the MISR can receive data from the 200-bit shift register in parallel (as an example). In these examples, loading (compressing) data using the MISR instead of the LFSR exhibits a 20,000% speed improvement.

As shown in FIG. 4, integrated circuit 99 may include a memory array 100 that has memory elements 102 arranged in 1000 rows and 100 columns. Memory elements 102 of integrated circuit 99 may be CRAM cells, static random-access-memory (SRAM) cells, or other types of memory cells.

Integrated circuit 99 may be placed in an error detection mode. In the error detection mode, error detection circuitry 109 may be used to detect soft errors in the memory elements of device 99.

Each row of memory cells 102 may be connected to a respective data line, whereas each column of memory cells 102 may be connected to a respective address line. Each group (column) of memory cells 102 that are controlled by a single address line may collectively be referred to as a frame (data frame).

The address lines of memory array 100 (e.g., address lines ADD1-ADD100) may be connected to address circuitry 104. Address circuitry 104 may be used to assert an address signal on a selected address line one at a time. Address circuitry 104 may, for example, include an address shift register, an address decoder, or other types of address control circuitry.

The data lines of memory array 100 (e.g., data lines DL1-DL1000) may be connected to error detection circuitry 109. Circuitry 109 may include data line circuitry 30 and error detection block 108. Data line circuitry 30 may include data register DRA and ten multiple input shift register (MISR) subcircuits 106 (as an example). Each of the ten MISR subcircuits 106 may have inputs that receive a tenth of the data lines. For example, the first MISR subcircuit may have 100 inputs that are connected to data lines DL1-DL100 whereas the tenth MISR subcircuit may have 100 inputs that are connected to data lines DL901-DL1000.

Each MISR subcircuit 106 may be connected to an associated register segment in data register DRA. For example, the first MISR subcircuit may have 100 outputs that are connected in parallel to 100 inputs of associated segment register SEG1 whereas the tenth MISR subcircuit may have 100 inputs that are connected in parallel to 100 inputs of associated segment register SEG10, as shown in FIG. 4. Each MISR subcircuit 106 and associated segment register that are connected in parallel may collectively be referred to as a multiple input shift register (e.g., MISR 107 of FIG. 4).

During error detection mode, address circuitry 104 may selectively enable one of the address lines to load a selected frame into MISRs 107 in parallel. Each frame may be loaded into MISRs 107 of data line circuitry 30 using this arrangement. When every frame in integrated circuit 99 has been loaded and compressed into MISRs 107, MISRs 107 may collectively provide a scanned multiple input shift register signature at their outputs.

Error detection block 108 may include another data register DRB and a signature comparator 110. Data register DRB may include ten segment registers SEG1'-SEG10' that correspond to the ten segment registers SEG1-SEG10 of data register DRA. The segment registers of data register DRB may be loaded with a precomputed MISR signature. For example, segment registers (e.g., registers SEG1'-SEG10') may each have 100 outputs. The precomputed MISR signature may be provided at the outputs of segment registers SEG1'-SEG10'.

Signature comparator 110 may be used to determine whether at least one soft error has been detected. MISR signature comparator 110 may receive at its first inputs the scanned MISR signature from data register DRA (e.g., from MISRs 107) and may receive at its second inputs the precomputed MISR signature from data register DRB. If the signature values at the first and second inputs are equal, then signature comparator 110 can output a low chip error signal L2_ERROR over error output line 112 to indicate that no soft error is detected. If the signature values at the first and second inputs do not match, then signature comparator can output a high error signal L2_ERROR over line 112 to indicate that at least one soft error on chip 99 has been detected.

The circuitry shown in FIG. 4 is merely illustrative. If desired, array 100 may have any number of data lines and data line circuitry 30 may be partitioned into any number of MISRs 107. In general, if there are n data lines and m MISRs 107, then each MISR 107 will have n/m inputs that receive data from n/m associated data lines.

Figure 5:
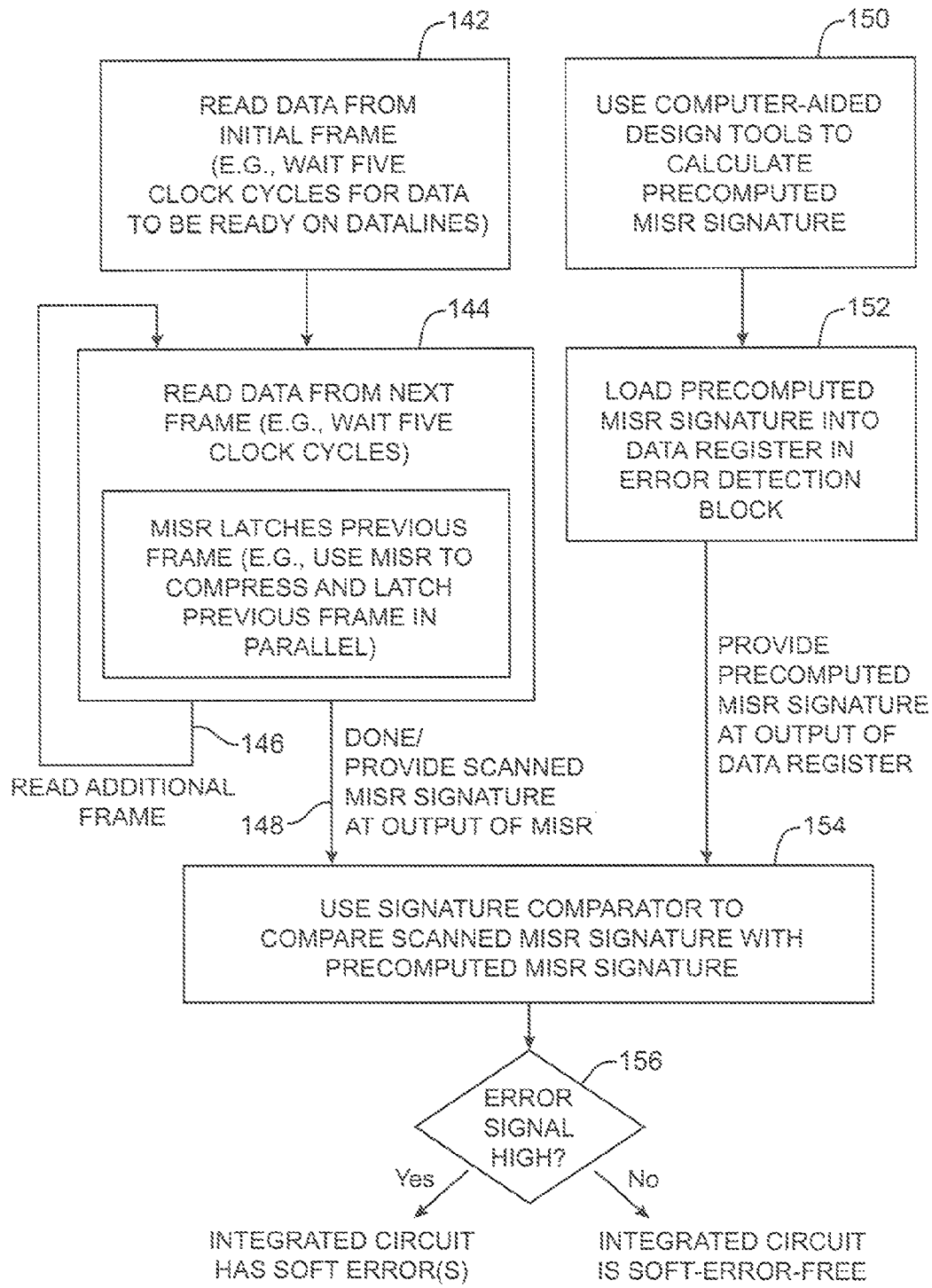
FIG. 5 is a flow chart of illustrative steps involved in detecting soft errors using error detection circuitry of the type shown in FIG. 4 in accordance with an embodiment of the present invention.

FIG. 5 illustrates steps involved in the operation of error detection circuitry 109. At step 142, data may be read from an initial frame (e.g., a first column of memory cells on an integrated circuit). It may take, for example, five clock cycles for address circuitry 104 and data circuitry 30 to perform necessary read and sense operations.

At step 44, data may be read from a successive frame, which may also take five clock cycles (as an example). MISRs 107 may be used to compress and latch data from the previous frame in parallel while the next frame is being read. Latching data from the previous frame in parallel takes only one clock cycle. Frames can therefore be read consecutively without any delay, because it takes more clock cycles to read data than to compress and latch that data from any given frame.

As indicated by line 146, additional frames may be read and compressed by MISRs 107. When all frames on device 99 have been read, scanning is complete (as indicated by line 148). At this point, data register DRA of FIG. 4 may output a scanned MISR signature at its output that is ready for comparison.

At step 150, computer-aided design (CAD) tools running on computing equipment (e.g., a computer) may be used to calculate a precomputed MISR signature. The CAD tools may include design and constraint entry tools, behavioral simulation tools, logic synthesis and optimization tools, placement and routing tools, analysis tools, etc.

Typically, the design process starts with the formulation of logic circuit functional specifications. A logic designer can specify how a desired circuit should function using the design and constraint entry tools. The design and constraint entry aids may be used to help a logic designer locate a desired design from a library of existing logic designs and may provide computer-aided assistance to the logic designer for entering (specifying) the desired design.

After the design has been entered using the design and constraint entry tools, the behavioral simulation tools may be used to simulate the functional performance of the design.

Once the functional operation of the logic design has been determined to be satisfactory, the logic synthesis and optimization tools may be used to implement the logic design in a particular programmable logic device (i.e., in the logic and interconnect resources of a particular programmable logic device product or product family). The logic design and optimization tools attempt to optimize the design by making appropriate selections of hardware to implement different logic functions in the logic design based on the logic design data and constraint data entered by the logic designer.

After logic synthesis and optimization, the logic design system may use the placement and routing tools to perform physical design steps (layout synthesis operations). The placement and routing tools are used to determine how to place the circuits for each logic function within the programmable logic device.

After an implementation of the desired logic design in the programmable logic device has been generated using the placement and routing tools, the implementation of the design may be analyzed and tested using the analysis tools. After satisfactory optimization operations have been completed, configuration data files may be produced.

An initial netlist may be synthesized to produce a post-synthesis netlist. User input and the post synthesis netlist are processed during place and route and optimization operations. The resulting netlist is processed further during an assembly process to produce a configuration data file output (e.g., a .pof or .sof file). This data file output may be used to determine the desired configuration bit settings to store in RAM cells 102 in circuitry 99.

The precomputed MISR signature may be produced as part of the configuration data file output. Configuration data loading tools may then be used to load the precomputed MISR signature into data register DRB of FIG. 4 as the CRAM cells on an integrated circuit are loaded (step 152). After this loading step, data register DRB may output the precomputed MISR signature at its output.

At step 154, signature comparator 110 of FIG. 4 may be used to compare the scanned MISR signature with the precomputed MISR signature. If signature comparator 110 outputs a high error signal, the integrated circuit that is being scanned has soft error(s), whereas if comparator outputs a low error signal, the integrated circuit is free of soft errors (step 156).

The duration of the error detection operations described in connection with FIG. 5 may be calculated using equation 2.

$$T_{ED}' = n_{FRAME} * T_{CLK} * 5 \tag{2}$$

As shown in equation 2, error detection time $T_{ED}'$ for error detection circuitry 109 is equal to the product of the number of frames $n_{FRAME}$, the clock period $T_{CLK}$, and the number five.

The first term $n_{FRAME}$ takes into account the number of frames that needs to be read for the entire chip. The second term $T_{CLK}$ takes into account the duration of each clock cycle. The third term takes into account the number of clock cycles it takes to read from each frame. In general, the third term may be any constant that reflects the number of clock cycles that is required to read from a given frame on an integrated circuit.

For example, consider a scenario in which error detection circuitry 109 of FIG. 4 is used to detect soft errors in an integrated circuit with 75,000 frames and 10,000 data lines. Error detection circuitry 109 may operate at 150 MHz (as an example). The resulting error detection time $T_{ED}'$ per-chip is therefore equal to 2.5 ms (75,000*[150*10⁶]⁻¹*5).

If conventional error detection circuitry 83 were to be used to scan for soft errors in this scenario, error detection time $T_{ED}$ would take 500 ms, as described in connection with FIG. 3. Use of error detection circuitry 109 of FIG. 4 may therefore result in a speed gain of 20,000% (500/2.5*100%) compared to a conventional arrangement. In general, speed gains may range from 1,000% to 30,000%. Speed gains of more than 30,000% or less than 1000% may also be achieved, if desired.

In general, the speed gain may be calculated by dividing the length of each segment register $n_{SEG}$ (e.g., the length of each MISR 107) by five, as shown in equation 4.

$$\text{Speed gain} = n_{SEG}/5 \tag{4}$$

The length $n_{SEG}$ of each MISR is equal to the number of data lines $n_{DL}$, divided by the number of segment registers that are used for the error detection operation in data line circuitry 30.

This improvement in test time is a result of significantly fewer clock cycles that are required to compress each frame. Error detection circuitry 109 may be operated at high clock frequencies (e.g., 150 MHz or more) for high error detection speed. If desired, error detection circuitry 109 may be operated at lower frequencies (e.g., 40 MHz or below) to reduce power consumption (e.g., by placing circuitry 109 in a low power mode).

Figure 6:
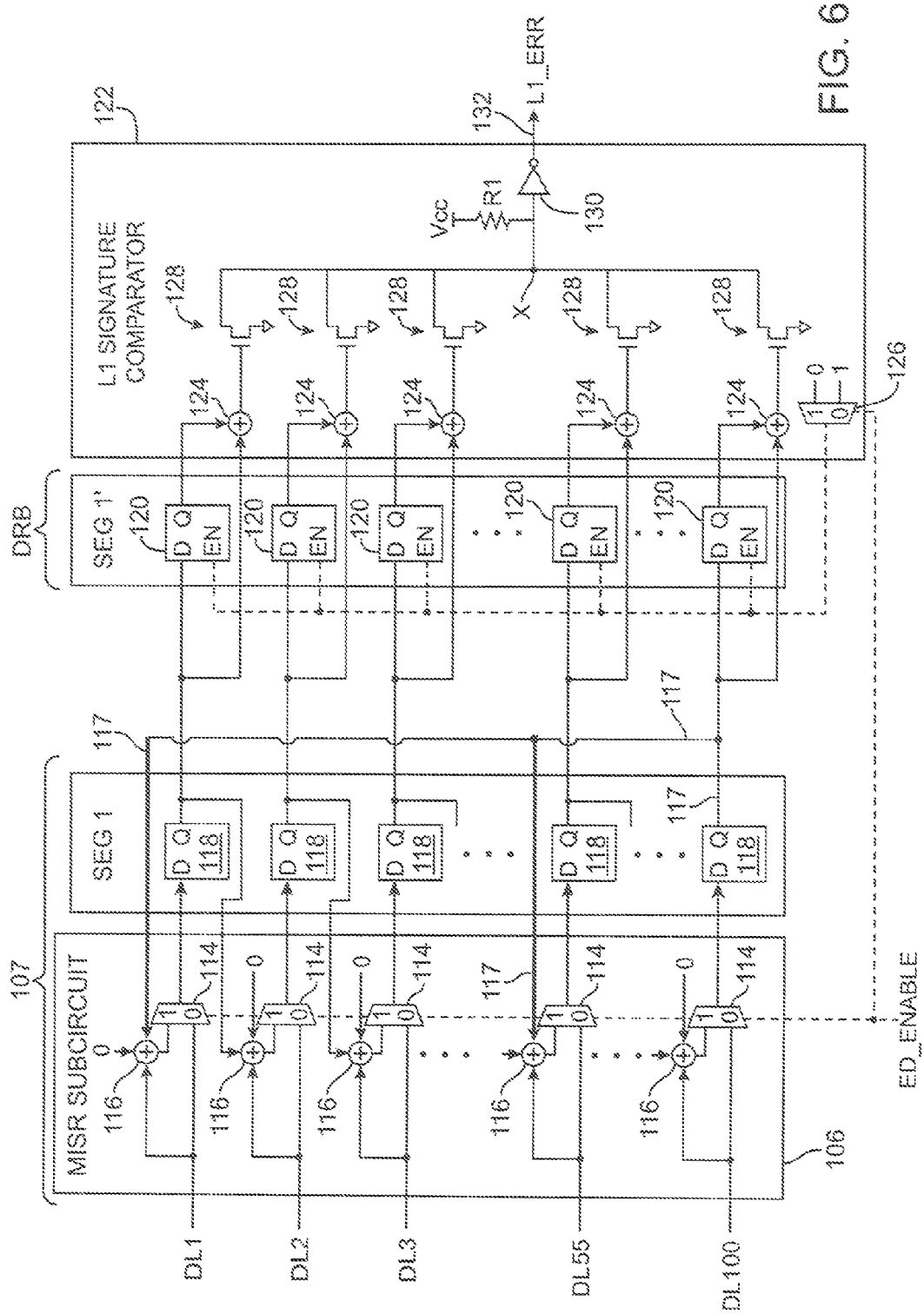
FIG. 6 is a circuit diagram of one illustrative segment of the error detection circuitry of FIG. 4 in accordance with an embodiment of the present invention.

FIG. 6 shows circuitry associated with one segment in error detection circuitry 109. Each MISR 107 may include MISR subcircuit 106 and a segment register such as SEG1. MISR 107 may have $n_{SEG}$ inputs (e.g., 100 inputs in this example) that are connected to $n_{SEG}$ corresponding data lines.

In this example, MISR 107 includes 100 multiplexers 114 and 100 logic XOR gates 116. Each multiplexer 114 may have first and second inputs and an output, whereas each XOR gate 116 may have first, second, and third inputs and an output. Each data line may be connected to the first input of a corresponding multiplexer 114 and the first input of a corresponding XOR gate 116.

Segment register SEG1 may include 100 flip-flops 118 (as an example) that are associated with the 100 multiplexers 114 and gates 116. Each flip-flop 118 has an input D and an output Q. The output of each multiplexer 114 may be connected to input D of a corresponding flip-flop 118. Output Q of each flip-flop 118 may be connected to the second input of XOR gate 116 that is associated with the next consecutive (adjacent) flip-flop 118. The second input of the first XOR gate 116 may be grounded (see, e.g., FIG. 6). A portion of XOR gates 116 may have third inputs that are grounded (i.e., supplied with zero volts). The remaining portion of XOR gates 116 may have third inputs that are connected to the output of the last flip-flop 118, as indicated by feedback line 117. Any desired feedback configuration may be implemented to provide MISR 107 with a desired compression scheme.

For example, a 70-bit MISR may have a feedback configuration that implements a primitive polynomial expression, as shown in expression 5.

$$x^{70}+x^{69}+x^{55}+x^{54} \tag{5}$$

The degree of the polynomial expression may correspond to the length (bit-width) of the MISR. Any desired polynomial expression may be implemented using MISR 107. The polynomial of expression 5 is merely illustrative.

Each multiplexer 114 may also have a control input that is controlled by control signal ED_ENABLE. Signal ED_ENABLE is low during normal operation of device 99 (e.g., a low ED_ENABLE configures multiplexers 114 to effectively bypass the MISR subcircuits and to directly connect the data lines to the corresponding flip-flops 118), whereas ED_ENABLE is high during the soft error detection mode (e.g., a high ED_ENABLE enables MISR 107 to compress each subsequent data frame).

As shown in FIG. 6, segment register SEG1' of data register DRB may include 100 flip-flops 120 (as an example). The number of flip-flops 120 in data register DRB may be equal to the number of flip-flops 118 in data register DRA. Each flip-flop 120 may have an input D, an output Q, and a control input EN. The output of each flip-flop 118 may be connected to the input of a corresponding flip-flop 120.

Register SEG1' may be connected to a level one (L1) signature comparator 122. L1 signature comparator 112 may serve to compare a portion of the scanned MISR signature outputted by each MISR 107 with a portion of the precomputed MISR signature loaded in each segment register in DRB. L1 signature comparator 112 may be part of signature comparator 110.

L1 signature comparator may include multiplexer 126. Multiplexer 126 may have a first input that is supplied with logic "1," a second input that is supplied with logic "0," a control input that is controlled by signal ED_ENABLE, and an output that is connected control input EN of each flip-flop 120.

During normal operation, ED_ENABLE is low, and a high signal is passed to the output of multiplexer 126 to enable flip-flops 120 to latch operational data. During error detection mode, ED_ENABLE is high and a low signal is passed to the output of multiplexer 126 to disable flip-flops 120 so that flip-flops 120 do not latch new data, because they should be holding the precomputed MISR signature values during error detection.

Comparator 122 may also include multiple comparator circuits that compare the values of MISR 107 and the corresponding segment register in parallel. Comparison is generally only relevant after all frames have been scanned and compressed by MISR 107, because only then will the MISR signature be ready for comparison.

Each comparator circuit may include a logic XOR gate 124 and a transistor 128. XOR gate 124 may have first and second inputs and an output. The first input of gate 124 may be connected the output of a corresponding flip-flop 118 whereas the second input of gate 124 may be connected to the output of a corresponding flip-flop 120 (see, e.g., FIG. 6). XOR gate 124 serves to compare the values provided by register DRA with the values provided by register DRB in parallel.

Transistors 128 may be n-channel transistors (as an example). Each transistor 128 may have a gate, a source terminal, and a drain terminal. The output of each XOR gate 124 may be connected to the gate of associated transistor 128 that is part of the same comparator circuit. The source terminal of each transistor 128 may be grounded whereas the drain terminal of each transistor 128 may be connected to a common node X, as shown in FIG. 6.

For example, each XOR gate 124 may compare the two MISR bit values provided at its two inputs. If the values match, then gate 124 will output logic "0." If the values do not match, then gate 124 will output logic "1." As long as at least one XOR gate 124 in L1 signature comparator 122 outputs logic "1," the corresponding transistor 128 will pull node X down to a low voltage level (e.g., 0 V, 0.1 V, 0.2V). Otherwise, if all XOR gates 124 output logic "0," then node X will remain high, because resistor R1 nominally pulls node X up towards positive power supply voltage Vcc. Each transistor 128 may therefore be designed with sufficient pull-down strength to overpower the pull-up drive strength provided through resistor R1 for proper functionality of signature comparator 122.

Node X may be connected to an input of inverter 130. Inverter 130 may have an output 132 that provides L1 error signal L1_ERR. In scenarios in which no error is detected by comparator 122, node X is high and L1_ERR is low. In scenarios in which there is at least one mismatch between the values provided by MISR 107 and the values of corresponding segment register 120 in DRB, node X will be pulled low and L1_ERR will be driven high to indicate the presence of soft error(s).

Integrated circuit 99 of FIG. 4 may be organized into different regions or blocks of logic. Each logic region may be associated with a group of CRAM memory cells. In general, the frames in each logic region may be compressed and provided to a corresponding L1 signature comparator 122 for soft error detection. L1 signature comparator 122 may therefore sometimes be referred to as a logic region signature comparator. For example, a high L1_ERR (i.e., a local logic region error signal) may indicate that at least one soft error exists in that particular logic region.

Figure 7:
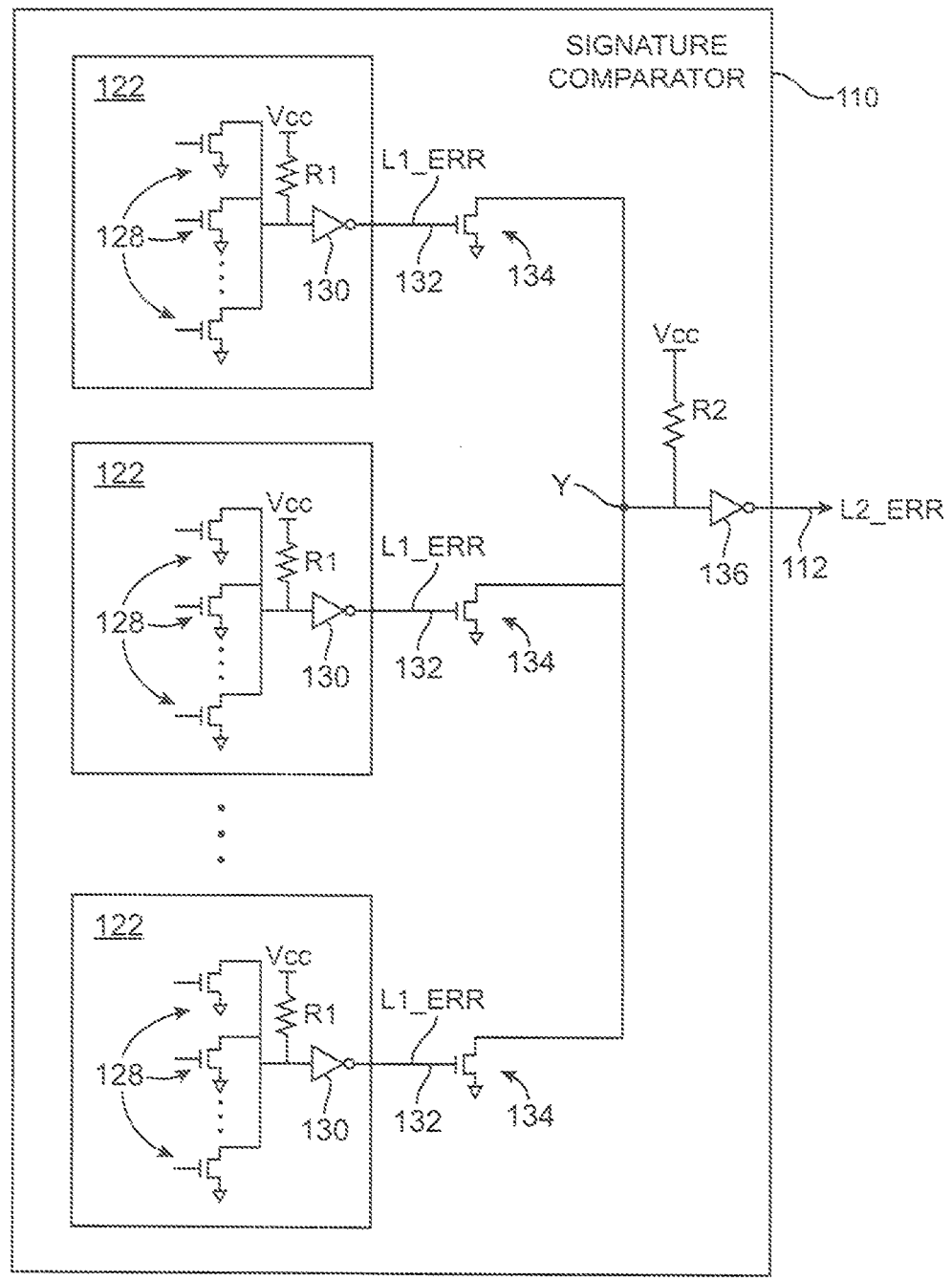
FIG. 7 is a circuit diagram of an illustrative signature comparator in accordance with an embodiment of the present invention.

Error detection may be determined on a per-chip basis, as shown in FIG. 7. As shown in FIG. 7, signature comparator 110 may further include transistors 134, resistor R2, and inverter 136. Transistors 134 may be n-channel transistors (as an example). The number of transistors 134 may be equal to the number of logic regions on device 99. L1 signature comparator 122 associated with each logic region may have output 132 that is connected to the gate of a corresponding transistor 134.

The source terminal of each transistor 134 may be grounded whereas the drain terminal of each transistor 134 may be connected to a common node Y, as shown in FIG. 7.

As long as at least one L1 signature comparator 122 outputs a high L1_ERR, the corresponding transistor 134 will pull node Y down towards zero volts. Otherwise, if all comparators 122 output a low L1_ERR, node Y will remain high, because resistor R2 nominally pulls node Y up towards positive power supply voltage Vcc. Each transistor 134 may therefore be designed with sufficient pull-down strength to overpower the pull-up drive strength provided through resistor R2 for proper functionality of signature comparator 110.

Node Y may be connected to an input of inverter 136. Inverter 136 may have an output 112 that provides L2 error signal L2_ERR. In scenarios in which the no error is detected on device 99, node Y is high and L2_ERR is low. In scenarios in which there is at least one mismatch between the scanned MISR signature and the precomputed MISR signature, node Y will be pulled low and L2_ERR will be driven high to indicate the presence of soft error(s) on device 99. The detection of errors in this way may sometimes be referred to as using a double error detection scheme, because errors can be detected at a local level (i.e., L1) and at a global level (i.e., L2).

The foregoing is merely illustrative of the principles of this invention and various modifications can be made by those skilled in the art without departing from the scope and spirit of the invention.

What is claimed is:

1. An integrated circuit, comprising
a plurality of random-access-memory elements; and
error detection circuitry that is coupled to the plurality of random-access-memory elements, wherein the error detection circuitry includes a plurality of multiple input signature registers, wherein each multiple input signature register in the plurality of multiple input signature registers has a plurality of inputs and outputs, and wherein the plurality of multiple input signature registers supply a multiple input signature register signature; and
a signature comparator that compares the multiple input signature register signature from the multiple input signature registers to a predetermined signature in parallel.

2. The integrated circuit defined in claim 1, wherein the inputs of each multiple input signature register in the plurality of multiple input signature registers are operable to receive data from the random-access-memory elements, and wherein the outputs of each multiple input signature register in the plurality of multiple input signature register are operable to provide a respective part of a multiple input register signature.

3. The integrated circuit defined in claim 1, wherein for each multiple input signature register, the number of the inputs for that signature register equals the number of the outputs for that signature register.

4. The integrated circuit defined in claim, 1 further comprising: a data register that stores a predetermined signature.

5. The integrated circuit defined in claim 1, wherein the random-access-memory elements are part of a memory element array having rows and columns of the random-access-memory elements and wherein the inputs of the multiple input signature registers are operable to receive data from a respective one of the rows of the random-access-memory elements.

6. The integrated circuit defined in claim 1, wherein the integrated circuit comprises a programmable integrated circuit having programmable circuitry and wherein the random-access-memory elements comprise configuration random access memory cells that are loaded with configuration data and that produce static output signals that control the programmable circuitry.

7. The integrated circuit defined in claim 1, wherein each of the multiple input signature registers comprises:
a multiple input signature register subcircuit coupled to the random-access-memory elements; and
a register that receives signals from the multiple input signature register subcircuit, that supplies signals to the multiple input signature register subcircuit, and that supplies part of a multiple input signature register signature.

8. A method of detecting soft errors in memory element circuitry, comprising:
storing data with the memory element circuitry with data;
with each multiple input signature register circuit in a plurality of multiple input signature register circuits, simultaneously receiving a respective portion of the stored data from the memory element circuitry;
with the plurality of multiple input signature register circuits, producing a corresponding signature based on the stored data;
loading a register with a precomputed multi-bit signature; and
with a signature comparator, comparing the signature produced by the multiple input signature register circuitry with the precomputed multi-bit signature in parallel to determine whether soft errors exist in the memory element circuitry.

9. The method defined in claim 8, wherein the memory element circuitry includes a memory element array having rows and columns of memory elements and wherein the multiple signature register circuitry has a plurality of inputs, the method further comprising:
with each of the inputs of the multiple signature register circuitry, receiving data from a respective one of the rows of the memory elements.

10. The method defined in claim 8, wherein loading the memory element circuitry with the data comprises loading the memory element circuitry with configuration data.

11. The method defined in claim 8, further comprising:
with design tools running on computing equipment, producing the precomputed signature.

12. Error detection circuitry, comprising:
a plurality of memory elements;
a register loaded with a precomputed signature, wherein the register has a plurality of outputs;
multiple input signature register circuitry having a plurality of inputs and a plurality of outputs that analyzes memory element data and that provides a corresponding signature, wherein the number of inputs for the multiple input signature register circuitry equals the number of outputs for the register, wherein the memory element data is received from a subset of the plurality of memory elements, and wherein each memory element in the subset is coupled to a common address line; and
a signature comparator that compares the signature with the precomputed signature.

13. The error detection circuitry defined in claim 12, wherein the multiple input signature register circuitry comprises a plurality of multiple input signature registers and wherein each of the multiple input signature registers comprises:
a multiple input signature register subcircuit; and
a data register that receives signals from the multiple input signature register subcircuit, that supplies signals to the multiple input signature register subcircuit, and that supplies part of the signature.

14. The error detection circuitry defined in claim 13, wherein each multiple input signature register includes a plurality of logic gates and wherein each logic gates has at least one input that receives signals from the data register in that multiple input signature register.

\* \* \* \* \*